United States Patent [19]

Hattori

[11] Patent Number: 5,047,364
[45] Date of Patent: Sep. 10, 1991

[54] METHOD FOR MAKING A MULTI-POINT EMISSION TYPE SEMICONDUCTOR LASER DEVICE

[75] Inventor: Ryo Hattori, Itami, Japan

[73] Assignee: Mitsubishi Denki Kabushiki Kaisha, Japan

[21] Appl. No.: 490,309

[22] Filed: Mar. 8, 1990

Related U.S. Application Data

[62] Division of Ser. No. 347,259, May 4, 1989, Pat. No. 4,916,710.

[30] Foreign Application Priority Data

Jun. 27, 1988 [JP] Japan .................................. 63-158608

[51] Int. Cl.⁵ ..................... H01L 21/20; H01L 21/265
[52] U.S. Cl. ............................. 437/129; 148/DIG. 95; 156/644; 437/67; 437/133; 437/48; 437/226; 437/974
[58] Field of Search ................ 148/DIG. 56, 51, 65, 148/72, 95, 119, 168, 169, 33, 33.1, 33.2, 33.4; 156/610–614, 644, 648, 649, 662; 357/16, 17, 47, 55, 56; 372/23, 50, 97; 437/61, 64, 67, 81, 89, 90, 108, 105, 107, 126, 129, 127, 133, 225, 226, 48, 905, 56, 974

[56] References Cited

U.S. PATENT DOCUMENTS

| | | |
|---|---|---|
| 3,930,912 | 1/1976 | Wisbey .............................. 437/127 |
| 3,968,564 | 7/1976 | Springthorpe ..................... 357/17 |
| 4,069,463 | 1/1978 | McGroddy et al. ............... 331/94.5 |
| 4,182,025 | 1/1980 | Wickenden ....................... 357/45 |
| 4,531,217 | 7/1985 | Kitamura .......................... 372/50 |
| 4,547,956 | 10/1985 | Bouadma et al. ................ 372/50 |
| 4,879,250 | 11/1989 | Chan ................................. 437/48 |

FOREIGN PATENT DOCUMENTS

| | | |
|---|---|---|
| 3447452 | 7/1985 | Fed. Rep. of Germany ...... 437/127 |
| 0040463 | 12/1970 | Japan ................................. 372/50 |
| 0033080 | 3/1978 | Japan ................................. 437/129 |
| 0072288 | 4/1985 | Japan ................................. 372/50 |
| 0223184 | 11/1985 | Japan ................................. 372/50 |
| 61-116891 | 6/1986 | Japan . |
| 1190829 | 5/1970 | United Kingdom . |
| 1228989 | 4/1971 | United Kingdom . |
| 2169134 | 7/1986 | United Kingdom . |
| 8000897 | 5/1980 | World Int. Prop. O. .......... 437/905 |

OTHER PUBLICATIONS

Uchida et al., "Integrated AlGaAs Two-Beam LD-PD Array . . .", Electron. Lett., vol. 22, No. 11, 22nd May 1986, pp. 585–587.

Kume et al., "A New Monolithic . . . Disk Applications", IEEE Journal of Quantum Electronics, vol. QE-23, No. 6, Jun. 1987 pp. 898–901.

Primary Examiner—Olik Chaudhuri
Assistant Examiner—William Bunch
Attorney, Agent, or Firm—Leydig, Voit & Mayer

[57] ABSTRACT

A multi-point light emission type semiconductor laser device including a plurality of light emission points which are produced on a p type or n type semiconductor layer monolithically and are capable of being driven independently includes electrically insulating or semi-insulating semiconductor regions provided at intermediate portions of light emission points in the p type or n type semiconductor layer. A separation groove is further produced up to reaching the insulating or semi-insulating regions from the side opposite to the semiconductor layer. Thus, respective light emission points are perfectly electrically separated each other by this separation groove and the region.

8 Claims, 3 Drawing Sheets

5,047,364

METHOD FOR MAKING A MULTI-POINT EMISSION TYPE SEMICONDUCTOR LASER DEVICE

This patent is a division of patent application Ser. No. 07/347,259, filed May 4, 1989, now U.S. Pat. No. 4,916,710.

FIELD OF THE INVENTION

The present invention relates to a multi-point emission type semiconductor laser device having independently driven lasers in which the respective lasers do not interfere with each other and the thermal interference between the respective lasers during operation can be reduced.

BACKGROUND OF THE INVENTION

FIG. 4 shows a multi-point light emission type semiconductor laser according to the prior art. In FIG. 4, reference numeral 1 designates a p type semiconductor substrate. N type GaAs current blocking layers 2a and 2b are disposed on substrate 1. P type $Al_{0.5}Ga_{0.5}As$ first cladding layers 3a and 3b are disposed on blocking layers 2a and 2b, respectively. P type $Al_{0.15}Ga_{0.85}As$ active layers 4a and 4b are disposed on first cladding layers 3a and 3b, respectively. N type $Al_{0.5}Ga_{0.5}As$ second cladding layers 5a and 5b are disposed on active layers 4a and 4b, respectively. N type GaAs contact layers 6a and 6b are disposed on second cladding layers 5a and 5b, respectively. Current injection grooves 7a and 7b are provided at current blocking layers 2a and 2b, respectively. Reference numerals 8a and 8b designate light emission points of the laser device. A separation groove 9 is provided between the two light emission points 8a and 8b. N side electrodes 10a and 10b are produced on the contact layers 6a and 6b, respectively. A p side common electrode 11 is provided on the p type GaAs substrate 1. This laser device is provided on the electrically insulating submount 12. Submount electrodes 13a and 13b are provided respectively corresponding to the light emission points 8a and 8b. In this figure, this laser device is a so-called junction down mounted device where the light emission points are close to the heat sink side.

The device operates as follows.

In this prior art device, since the separation groove 9 is reaches the substrate 1, light emission points 8a and 8b are separated and do not have a common n side region. When a forward direction bias is applied between n side electrode 10a and p side electrode 11, a laser oscillation occurs at light emission point 8a, and when a forward direction bias is applied between n side electrode 10b and p side electrode 11, a laser oscillation occurs at light emission point 8b. In this way, the respective light emission points can be driven independently.

Furthermore, this prior art laser device is junction down mounted as shown in FIG. 4, and n side electrodes 10a and 10b are connected with the submount side electrodes 13a and 13b, respectively, but insulated from each other, thereby enabling independent operation of the light emitting points. The heat resistance from the respective light emission points to the heat sink is low and superior heat irradiation is obtained. Therefore, thermal interference between the respective light emission points during operation are greatly improved relative to junction up mounted in which the substrate side is bonded toward the heat sink.

In the prior art multi-point light emission type semiconductor laser device of such a construction, the respective light emission points commonly have the substrate at the p side, and they are not perfectly electrically isolated. Accordingly, the light emission output from one of the light emission points is subjected to variations dependent on the on/off operation of the other light emission point, which results in a severe problem in practical use. Furthermore, when the prior art multi-point light emission type semiconductor laser device is junction down mounted, the solder flows out, and the respective separated electrodes may be electrically short-circuited, thereby resulting in the largest problem in the production of this laser device. Although modifications in the configuration of the submount may be adopted as measures against these problems, these modifications cannot be adopted in junction down mounted multi-point light emission type semiconductor laser devices having more than three light emission points. A method of circulating an electrode so as not to shield the light emission from the rear side laser facet also cannot be used as a solution.

SUMMARY OF THE INVENTION

An object of the present invention is to provide a multi-point light emission type semiconductor laser device capable of electrically isolating the respective light emission points from each other without any modification in a submount in a junction down mounting.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, the intermediate portions of the respective light emission points of p type or n type semiconductor layer including a plurality of light emission points are monolithically produced with an insulating or semi-insulating semiconductor. A separation groove is provided to reach the insulating or semi-insulating semiconductor portion to electrically separate the respective light emission points. By such a construction, the respective light emission points can be independently driven without necessitating electrical isolation at the side of submount in a junction down mounting. Electrical intereference can be reduced to a negligible value because only the metal electrode of submount is commonly to the light emission points.

According to another aspect of the present invention, a single protrusion or plurality of protrusions are formed on an electrically insulating or semi-insulating semiconductor substrate, and a p type or n type semiconductor layer is disposed thereon burying the convex type stripe. A semiconductor laser structure of the multi-point light emission type in which the light emission points are positioned at other than a region on the protrusion is produced thereon. A region other than the protrusion of the insulating or semi-insulating semiconductor substrate is removed from the substrate side by polishing or etching to expose the p type or n type semiconductor layer. A groove is produced to separate the respective light emission points and to reach the protrusion from the surface opposite the substrate.

DETAILED DESCRIPTION OF THE PREFERRED EMBODIMENTS

An embodiment of the present invention will be described in detail with reference to the drawings.

Figure 1:
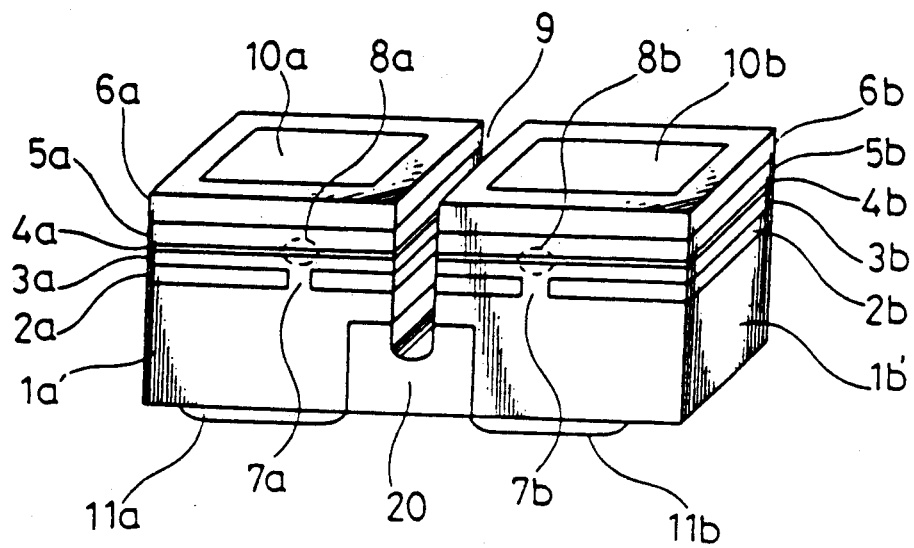
FIG. 1 is a perspective view showing a multi-point light emission type semiconductor laser device according to an embodiment of the present invention.

FIG. 1 shows a perspective view of a multi-point light emission type semiconductor laser device according to an embodiment of the present invention. In FIG. 1, reference numerals 1a' and 1b' designate p type semiconductor substrates. N type GaAs current blocking layers 2a and 2b are disposed on substrates 1a' and 1b', respectively. P type $Al_{0.5}Ga_{0.5}As$ first cladding layers 3a and 3b are disposed on blocking layers 2a and 2b, respectively. P type $Al_{0.15}Ga_{0.85}As$ active layers 4a and 4b are disposed on first cladding layer 3a and 3b, respectively. N type second cladding layers 5a and 5b are disposed on active layers 4a and 4b, respectively. N type GaAs contact layers 6a and 6b are disposed on second cladding layers 5a and 5b, respectively. Current injection regions 7a and 7b are provided in blocking layers 2a and 2b, respectively. Reference numerals 8a and 8b designate light emission points of the laser device. A separation groove 9 is provided between light emission points 8a and 8b. N side electrodes 10a and 10b are produced on contact layers 6a and 6b, respectively. P side electrodes 11a and 11b are provided on substrates 1a' and 1b', respectively. Reference numeral 20 designates a semi-insulating GaAs layer.

FIG. 2 shows the production process flow for producing the structure of the multi-point light emission type semiconductor laser device of FIG. 1. In FIG. 2, reference numeral 20' designates a semi-insulating GaAs substrate and reference numeral 1" designates a p type GaAs layer.

The production process of the device will be described.

Figure 2A:
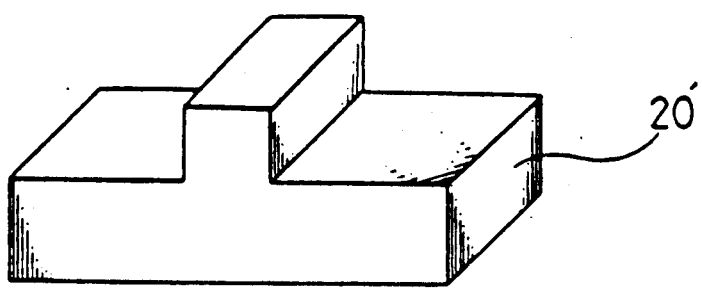
FIGS. 2(a)–2(e) are diagrams showing a production process for producing the laser device of FIG. 1.
Figure 2B:
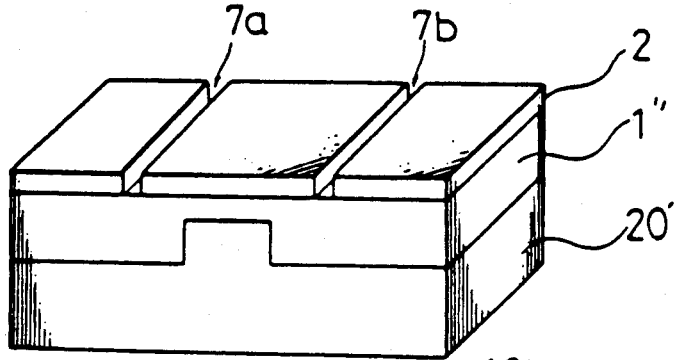
Figure 2C:
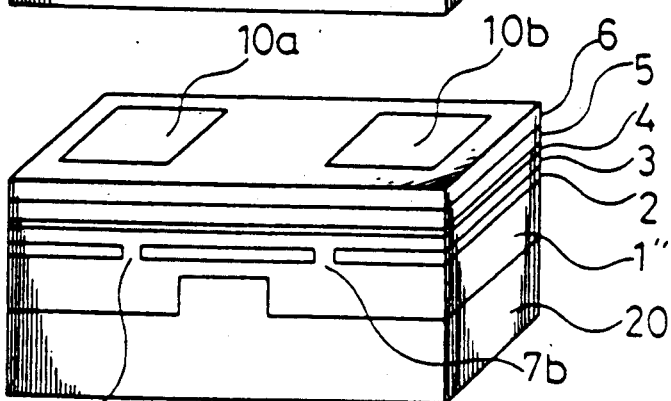
Figure 2D:
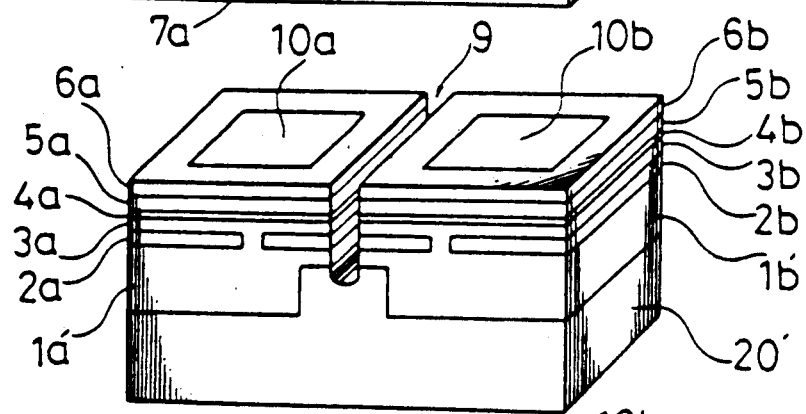
Figure 2E:
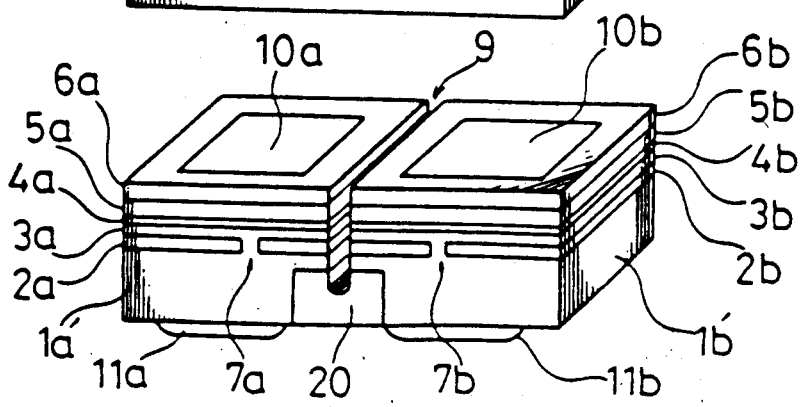
Figure 4:
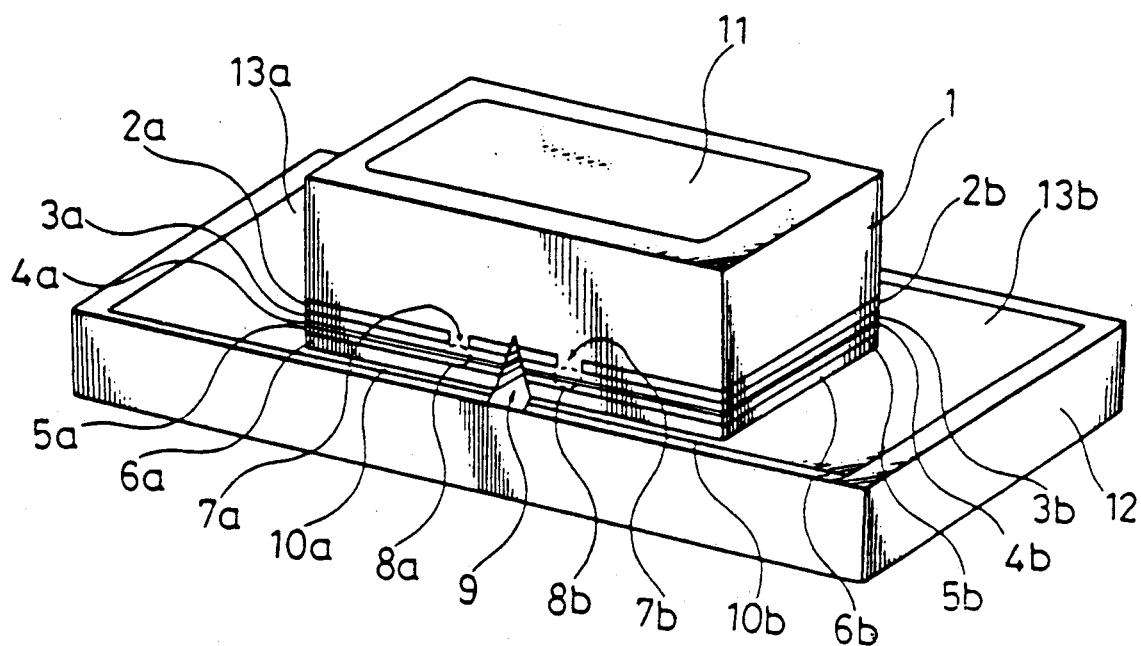
FIG. 4 is a perspective view showing a multi-point light emission type semiconductor laser device according to the prior art which is junction down mounted.

First of all, a protrusion is formed on the semi-insulating GaAs substrate 20' by RIE (reactive ion etching) or RIBE (reactive ion beam etching) as shown in FIG. 2a. Next, this protrusion is buried by growing p type GaAs layer 1" by liquid phase epitaxy. The surface of the grown p type GaAs layer 1" is made planar, for example, by polishing, and an n type current blocking layer is deposited thereon. Thereafter, grooves 7a and 7b corresponding to the respective positions of the light emission points are formed as shown in FIG. 2b. Thereafter, a first cladding layer 3, an active layer 4, a second cladding layer 5, and a contact layer 6 are deposited by an appropriate growth technique as shown in FIG. 2c. N side electrodes 10a and 10b are deposited on and from ohmic contact with the contacts layer 6. Then, as shown in FIG. 2d, a separation groove 9 extending from contact layer 6, through the intermediate layers, and reaching the protrusion of the substrate 20' is formed, for example, by etching. Thereafter, a portion of the substrate 20' is removed by polishing or etching to expose the p type GaAs layers 1a' and 1b', but leaving the protrusion portion of substrate 20' in place. P side electrodes 11a and 11b are deposited on and from ohmic contacts with the exposed p type GaAs layer 1a' and 1b', respectively, thereby producing the structure shown in FIG. 1.

The device operates as follows.

In the laser device produced as described above, the light emission points 8a and 8b are electrically separated by separation groove 9 and insulating layer 20 so they do not have an electrically common region. Therefore, electrical interference during operation of the respective light emission points can be reduced to a negligible value. Furthermore, since the electrode at the submount side can be made common to all the light emission points in a junction down mounting, no countermeasures against undesirable solder flow and modifications in the electrode wiring are necessary, thereby greatly enhancing the yield.

In the production of the multi-point light emission type semiconductor laser device of the present invention, the p type GaAs semiconductor buried layer is made flat and this makes it possible to utilize various practical methods for producing a laser structure.

While in the above described embodiment a two-point light emission type semiconductor laser is described, a junction down mounted multi-point light emission type semiconductor laser device having more than three light emission points, which has been quite difficult to produce, can be easily realized.

Figure 3:
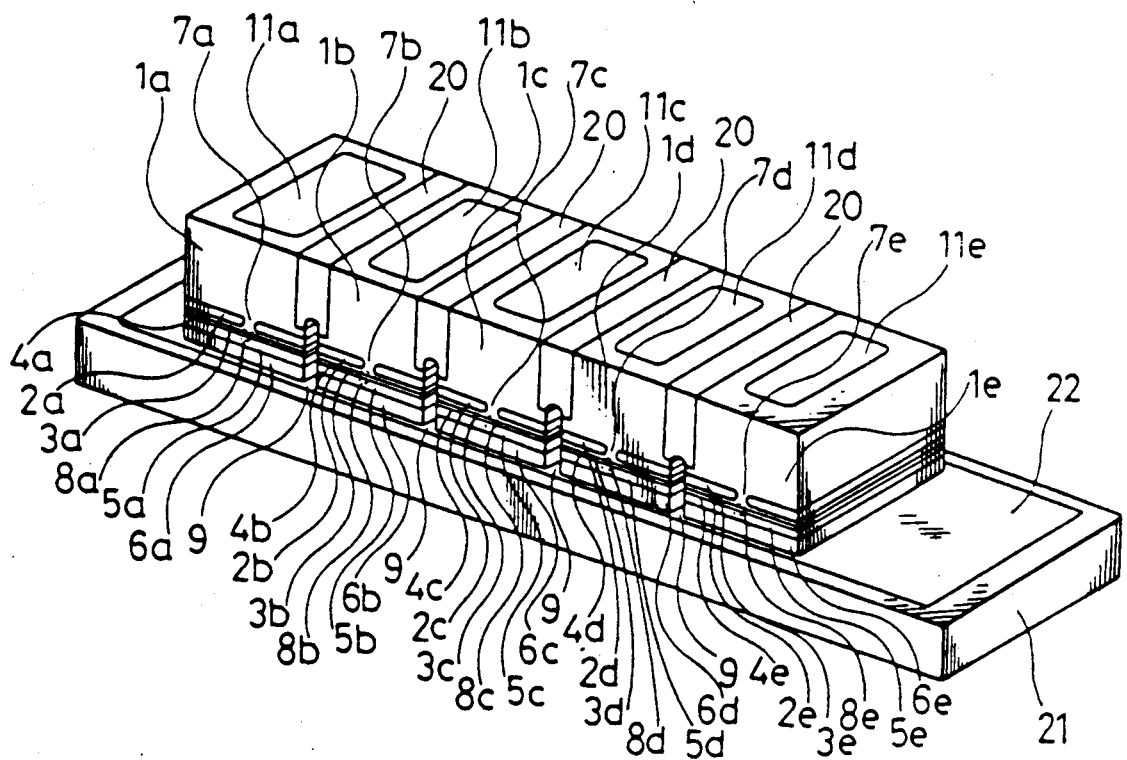
FIG. 3 is a perspective view showing a multi-point light emission type semiconductor laser device according to another embodiment of the present invention which is junction down mounted.

FIG. 3 shows five-point light emission type semiconductor laser device that is junction down mounted on a submount and has a single electrode according to another embodiment of the present invention. In FIG. 3, the same reference numerals as those shown in FIG. 1 designate the same or corresponding elements. Reference character suffixes a, b, c, d, and e represent corresponding elements of the light emission points 8a, 8b, 8c, 8d, and 8e, respectively. Reference numeral 21 designates a submount and reference numeral 22 designates a submount electrode. As shown in FIG. 3, since the p side electrode for each light emission point is separate at the chip side even if the device is junction down bonding onto the common electrode 22, the respective light emission points from 8a to 8e can be independently driven through wires bonded to the p side electrodes, 11a to 11e, respectively. Even in this case, since only metal electrode 22 at submount 21 side is common to all light emission points as described above, mutual electrical interference due to the operation of the respective light emission points can be reduced to quite small values.

As discussed above, according to the present invention, electrically insulating or semi-insulating semiconductor regions are provided intermediate portions the light emission points of an active semiconductor layer in a laser device including a plurality of light emission points. The structure is produced monolithically and the individual light emission points are capable of being driven independently. A separation groove structure and the active layer from the side of the structure opposite the insulating or semi-insulating semiconductor electrically isolates the respective light emission points from each other. Accordingly, the electrical interference during operation of the respective light emission points is reduced to a negligible value in practical use.

Furthermore, since the submount side electrode is common to all light emission points in junction down mounting, no steps to prevent undesired solder flow on the submount or other short circuiting in the electrode wiring are needed, greatly increasing yield. Furthermore, the junction down mounting of a multi-point light emission semiconductor laser having having three or more light emission points can be easily realized.

What is claimed is:

1. A method of making a multi-point light emission type semiconductor laser device comprising:

producing at least one protrusion on an electrically insulating or semi-insulating semiconductor substrate;

depositing a semi-conductor layer on said substrate to bury said protrusion;

depositing a semiconductor laser structure including multiple light emission points, each of said light emission points being separated from adjacent light emission points by a said protrusion;

removing a portion of said insulating or semi-insulating semiconductor substrate from the substrate side without removing said protrusion to expose the surface of said semiconductor layer; and forming a groove which separates the respective light emission points extending into said protrusion from the side of the device opposite the substrate.

2. The method of claim 1 wherein after depositing said semiconductor layer, said semiconductor layer is made planar before depositing said semiconductor laser structure thereon.

3. A method of making a semiconductor laser device for junction down mounting including at least two light emission points comprising:

forming at least one protrusion on an electrically isolating substrate;

depositing a first semiconductor contacting layer of a first conductivity type on said substrate to bury said protrusion;

depositing a semiconductor current blocking layer of a second conductivity type on said first contacting layer;

forming a groove through said current blocking layer to said first contacting layer for each light emission point of said device, one of said protrusions being disposed intermediate adjacent grooves;

depositing a first semiconductor cladding layer of the first conductivity type on said current blocking layer and on said first contacting layer in the grooves;

depositing an active semiconductor layer on said first cladding layer;

depositing a second semiconductor cladding layer of the second conductivity type on said active layer;

forming at least one isolating groove in said structure, each groove extending from said second contact layer to one of said protrusions, thereby producing laser elements separated by isolating grooves;

removing a portion of said isolating substrate to expose said first contacting layer while leaving said protrusion in place; and applying first and second electrodes to said first and second contacting layers, respectively, of each laser element.

4. The method of claim 3 including mounting the device on a common substrate with said second electrodes in electrical contact with a common device electrode disposed on said common device substrate.

5. The method of claim 3 including forming a relatively planar surface on said first contacting layer opposite said substrate before depositing said current blocking layer.

6. The method of claim 3 including forming said grooves in said current blocking layer and said at least one isolating groove by etching.

7. The method of claim 3 including removing a portion of said isolating substrate by etching.

8. The method of claim 3 including removing a portion of said isolating substrate by polishing.

* * * * *